(12) United States Patent
Candy

(10) Patent No.: US 6,798,285 B2
(45) Date of Patent: Sep. 28, 2004

(54) AMPLIFIER IMPROVEMENTS

(75) Inventor: Bruce Halcro Candy, Basket Range (AU)

(73) Assignee: BHC Consulting Pty., Ltd., Glenside (AU)

(*) Notice: Subject to any disclaimer, the term of this patent is extended or adjusted under 35 U.S.C. 154(b) by 0 days.

(21) Appl. No.: 10/237,155

(22) Filed: Sep. 6, 2002

(65) Prior Publication Data

US 2003/0058044 A1 Mar. 27, 2003

(30) Foreign Application Priority Data

Sep. 7, 2001 (AU) ............................................. PR7521

(51) Int. Cl.$^7$ ................................................. H03F 1/36
(52) U.S. Cl. ...................................... 330/109; 330/260
(58) Field of Search ................................ 330/109, 260, 330/103, 271, 293; 327/345

(56) References Cited

U.S. PATENT DOCUMENTS

| 4,110,692 A | * | 8/1978 | Pradal | ......................... 455/110 |
| 4,636,053 A | * | 1/1987 | Sakane et al. | .............. 396/101 |
| 5,317,277 A | * | 5/1994 | Cavigelli | ..................... 330/109 |

* cited by examiner

*Primary Examiner*—Henry Choe
(74) *Attorney, Agent, or Firm*—Osha & May L.L.P.

(57) ABSTRACT

An ultra-low distortion electronic amplifier wherein the global dominant pole is formed by the selection of circuit and component arrangement within the input stage, such that the global dominant pole, is of third order, at audio frequencies. This audio power amplifier implements a high order global dominant pole with the use of operational amplifiers, and this high order dominant pole is distributed across both the voltage amplification stage and input stage without adverse reduction in the slew rate. The amplifier has increased negative feedback at audio and ultrasonic frequencies, giving a reduction in distortion across the entire audio band and some of the lower ultrasonic band.

16 Claims, 4 Drawing Sheets

AMPLIFIER IMPROVEMENTS

This invention relates to both an amplifier and to a method of achieving low distortion in an amplifier.

This invention has particular application to audio amplifiers.

BACKGROUND ART

There has been considerable human effort into attaining low distortion in amplifiers of many applications at all frequencies. In 1950, the best audio power amplifiers produced distortion of about 0.1% at 1 kHz, and in the 1990s, this was reduced to about 0.001% at 1 kHz, and about 0.02% at 20 kHz, although one manufacturer claims 0.0025% at 20 kHz.

A majority of commercial audio power amplifiers more or less follow standard designs.

Details of some examples of these are given in a review by Douglas Self in a series of articles in "Electronics World+Wireless World" from August 1993 to January 1994, and also in his book, ISBN 0-7506-2788-3, "Audio power amplifier design handbook," Newness, reprinted 1997/8 and a second edition ISBN 0 7506 4527 X, also Newness, 2000. Another book containing a comprehensive review of amplifiers, is authored by Ben Duncan called "High performance Audio Power Amplifiers," Newness ISBN 0 7506 2629 1, 1996, reprinted 1997/8.

There are some exceptions to these designs: A Technics SE-A1 amplifier which is known of in some countries incorporates an A-class output stage supplied by a floating low voltage high current power supply. This power supply is connected to B-class High Voltage Output Stage.

An LT1166 integrated circuit is primarily intended to control quiescent bias feeding output transistors in audio amplifiers. The LT1166 consists of a low gain transconductance differential amplifier (gain of 0.125 mho) with an inverting and a non-inverting input. The circuitry has a local negative feedback path connecting an output of the power output stage to the inverting input of the transconductance amplifier. The input of the output stage is the non-inverting input of the transconductance amplifier. Two local dominant poles for stability are formed by the use of shunt capacitors to ground from the transconductance amplifier's outputs. This Linear Technology application circuitry promises distortions no less than many currently existing commercial products.

In Journal of Audio Engineering Society, vol. 29, no 1/2, January/February 1981, pages 27–30, M. J. Hawksford, discloses as a mere paper publication a theoretical means of cancelling distortion in any amplifier stage, including the output stage. This is achieved by subtracting the signals feeding the output power transistors inputs from the amplifier output, and then adding this signal back into the signal driving the output transistors' inputs.

Iwamatsu in U.S. Pat. No. 4,476,442 again as a mere paper publication disclosed circuitry based on the principles of Hawksford. In one embodiment, Iwamatsu discloses floating power supplies supplying the adding and subtracting circuitry. These floating supplies follow a voltage equal to the sum of the output signal plus a signal linearly proportional to the current flowing through the output load. However, Iwamatsu's circuits do not include local dominant poles.

Robert R. Cordell in "MOSPOWER APPLICATIONS," Siliconix Inc. ISBN 0-930519-0, 1984, 6.6.3 discloses an audio power amplifier essentially the same as one of the Hawksford's circuits, but including the essential local dominant poles required for stability. This circuit has no provision for thermal stability, nor floating power supply rails, which are rare in amplifiers.

The current inventor Bruce H Candy previously in U.S. Pat. No. 5,892,398 as a mere paper publication only, discloses an amplifier also utilizing the principles of Hawksford, but including local dominant poles required for stability, thermal tracking circuitry for thermal stability, floating power supplies which track the output signal, rather than to the sum of the output signal plus a signal linearly proportional to the current flowing through the output load as in the case of Iwamatsu. Candy also discloses an output stage input current source load which is also supplied by power form the floating power supplies. Candy claims that it is possible with this arrangement to attain a distortion of the order of 1 part per million at 20 kHz at several hundreds of watts output.

Williamson et al. in U.S. Pat. No. 5,396,194 describes as a mere paper publication a switch mode amplifier containing floating low voltage high current power supplies which supply an A-class amplifier. This is similar to the Technics SE-A1 except that the drive circuitry is switch-mode rather than class-B and that the power supplying the A-class amplifier is derived from the switch mode power supply rather than a separate power supply. All the claims are concerned with the switching power saving technique.

In one of the Williamson paper descriptions there was described floating power supplies to supply small signal operational amplifiers which are connected as servo loops to control the current flowing through the output devices. There are two feedback paths containing a capacitor which form two local dominant poles which are essential for stability.

The current inventor Bruce H Candy has considered an amplifier consisting of at least one operational amplifier, a first error correction amplifier, connected up as a servo loop to control the output voltage, as opposed to the output current as in the case of Williamson et al. These operational amplifiers would be supplied by power from floating power supplies which track the output voltage.

Candy further has considered a local dominant pole being required for stability, and the advantages of using wide-band operational amplifiers, with gain bandwidth products of more than 100 MHz. In addition, Candy has considered a second error correction amplifier, consisting of another operational amplifier, also preferably wide-band, connected up as a servo loop to control the output voltage stage which includes the first error correction amplifier. In other words, Candy has considered a $2^{nd}$ order local dominant pole formed by the signal path being amplified by two error correction stages in series.

This also would be supplied by the floating power supplies. Further considered are the advantages of implementing high gain stages with local negative feedback and the attendant local dominant poles required for stability in other stages of the amplifier to reduce distortion. This arrangement does not require the precise setting of the adding and subtracting electronics disclosed by Hawksford and related circuits.

Audio power amplifiers usually consist of three definable stages: an input stage, voltage amplifier stage and output stage. Sometimes, the amplifier input stage and the voltage amplifier stage together are called the amplifier input stage. In power amplifiers, the output stage, sometimes called the power output stage, usually produces most distortion.

However, the distortion of the power output stage may be substantially reduced by some of the concepts considered by me previously. Compared to these distortion reduced power output stages, the lowest distortion conventional input stages and voltage amplifier stages may produce substantially greater distortion. Conventional low distortion input stages are usually a differential voltage to current converter which produce a differential output current. In these low distortion traditional architectures, the differential current output of this input stage is connected to a current mirror, and the output node of the differential current output of the input stage and current mirror is connected to a common emitter cascode amplifier; the said common emitter amplifier sometimes being a Darlington. The amplifier's dominant pole is set by a network including a capacitor connected between the output and input of this common emitter cascode stage.

In his second edition, Douglas Self disclosed the advantages of a second order global dominant pole, consisting of splitting the integrating capacitor in the voltage amplification stage, that is the said dominant pole setting capacitor, and connecting a resistor between ground and the said common split capacitor node. This allows for more overall global feedback, and thus reduced distortion. However, this adversely affects the amplifier slew rate owing to lower loading impedance on the output of the voltage amplification stage.

Linear Technology describes in application note AN67 a "super gain block" small signal amplifier consisting of effectively a $5^{th}$ order global dominant pole. This is claimed to have an open loop gain of 180 dB at 10 kHz.

An object of this invention is to provide improvements which assist in even more accurate amplification or at least, provides the public with a useful alternative. This has particular application to audio power amplifiers, herein defined to produce at least 5W into 8 ohms at least at audio frequencies.

DISCLOSURE OF THE INVENTION

In one form of this invention this can be said to reside in an electronic amplifier having an input, and an output, and including an output stage containing output transistors being connected to the electronic amplifier output, the electronic amplifier input being connected to an input stage, an output of the input stage being connected to an input of the output stage, wherein a global dominant pole is formed which, not taking into account effects of any output stage local dominant pole, is at least of third order, at least at audio frequencies and lower ultrasonic frequencies.

In preference the electronic amplifier includes within the input stage, at least two amplifiers, a first and second amplifier, wherein the electronic amplifier input is connected to an input of the first amplifier, and an output of the first amplifier is connected to an input of the second amplifier, and an output of the second amplifier is connected to an input of the output stage, wherein there are at least two local negative feedback paths, a first and second local negative feedback path, a first local negative path being between an output of the first amplifier and an input of the first amplifier, a second local negative path being between an output of the second amplifier and an input of the second amplifier, and an overall negative feedback path is connected between an input of the first amplifier and the output stage, wherein there is at least a third order global dominant pole, at least at audio frequencies, when effects of any output stage local dominant pole are not taken into account.

In preference, a first local negative feedback path forms at least a local dominant pole about the first amplifier, a first local dominant pole, and the second local negative path forms at least a local dominant pole about the second amplifier, a second local dominant pole, and the said first local dominant pole is at least first order and the said second local dominant pole is at least second order, at least at audio frequencies.

In preference, in the alternative, the said second local dominant pole is at least first order and the said first local dominant pole is at least second order, at least at audio frequencies.

In preference, the said second amplifier consists of two series connected amplifiers, a third and fourth amplifier, and the said second local negative feedback path is connected between an output of the fourth amplifier and the input of the said third amplifier, and a third local negative feedback path is connected between an output of the third amplifier and an input of the third amplifier.

In preference, the output stage includes an output error correction stage containing at least one amplifier, a fifth amplifier, an input to the output stage being connected to an input of the fifth amplifier, wherein there are at least two local negative feedback paths, a fifth and sixth local negative feedback path, a fifth local negative feedback path being between an output of the output stage and an input of the fifth amplifier and a sixth local negative path being between an output of the fifth amplifier and an input of the fifth amplifier, an output of the fifth amplifier is connected to an input of output stage transistor buffers or the output stage transistors, an output of output stage transistor buffers, if used, being connected to an input of the output transistors, wherein the circuit arrangement and values of the said fifth and sixth local negative feedback paths and fifth amplifier and output transistors and output transistor buffers are selected to contain at least a first order local dominant pole, a third local dominant pole, at least at audio frequencies.

In preference, at least one of the said first, second, third or fifth amplifier is a wideband differential operational amplifier with a gain-bandwidth product of greater than 100 MHz and direct current open loop differential voltage gain of more than 200V/V.

In preference, the fifth amplifier is supplied by power from a floating power supply means coupled to an output of the output stage so that a voltage of the floating power supply supplying the fifth amplifier will follow substantially an output voltage of the output stage when operational.

In preference, the said third local dominant pole is at least second order.

In preference, the electronic amplifier is capable of delivering at least 5 Watts output into 8 ohms at least at audio frequencies.

An advantage of the invention lies in the discovery that high order global dominant poles may also be implemented in audio power amplifiers, and that this may quite easily be implemented with the use of operational amplifiers, and this high order dominant pole may be distributed across both the voltage amplification stage and input stage, without adverse reduction in slew rate.

This allows for considerably more negative feedback at audio and ultrasonic frequencies, thereby enabling considerable reduction in distortion across the entire audio band and some of lower ultrasonic band.

Further aspects of the invention including the scope of the invention can be gained by reference to the following description and the claims.

For a better understanding of this invention it will now be described with reference to a preferred embodiment which is described hereinafter with reference to drawings as follows

DESCRIPTION OF THE PREFERRED EMBODIMENT

Figure 1:
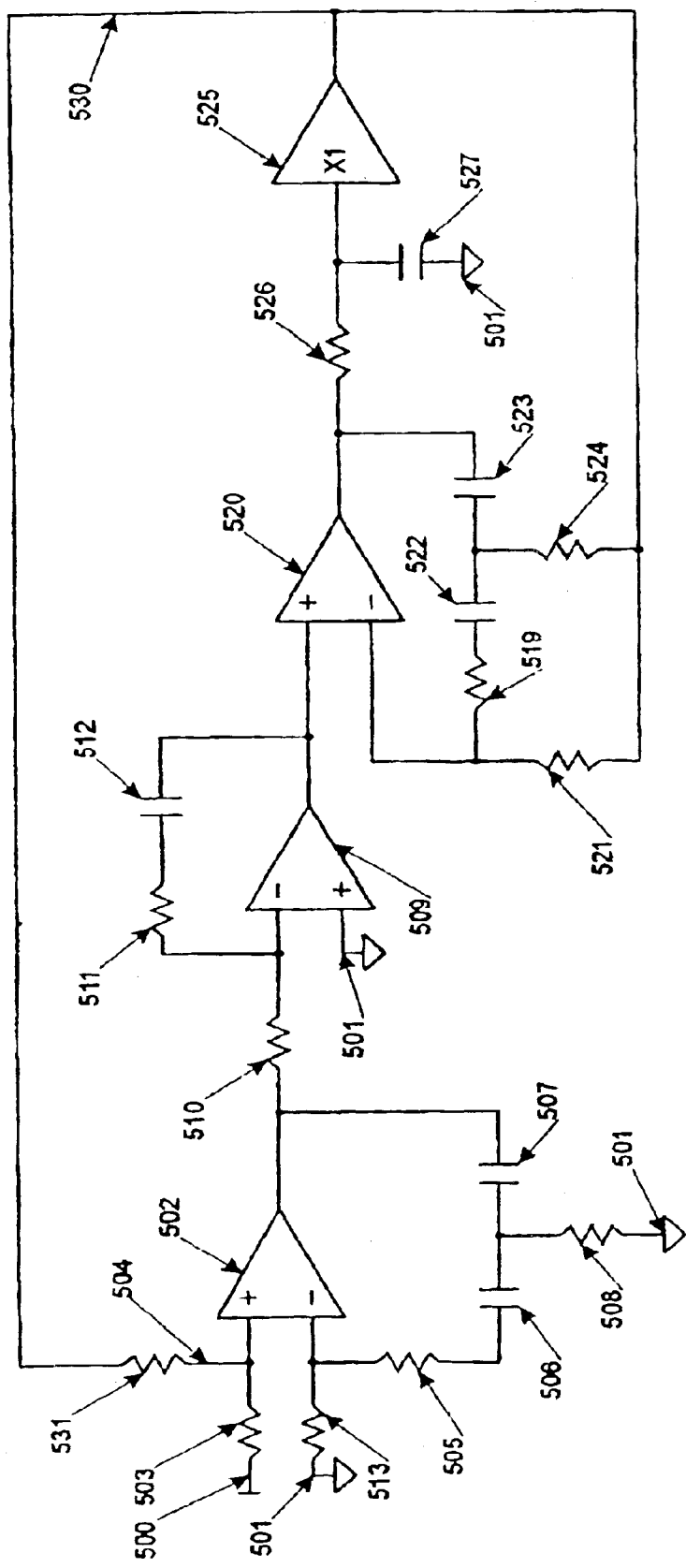
FIG. 1 shows a basic block diagram illustrating the location of the local and dominant pole forming networks in an amplifier.

With reference to FIG. 1, which shows a basic block diagram illustrating the location of the local and dominant pole forming networks in an amplifier:

An amplifier input is provided at 500 relative to earth 501. An amplifier output is provided between at 530 relative to earth 501. In this basic diagram, the amplifier output stage, which includes output transistors, is modelled very approximately by a first order low-pass filter consisting of resistor 526 and capacitor 527 connected to ground. The common node of 526 and 527 is connected to a unit gain buffer amplifier 525. The output of 525 provides the amplifier output 530. Overall negative feedback is provided by a resistor 531 connected between 530 and the overall amplifier inverting input 504, which is located at the non-inverting input of the differential amplifier 502. Resistor 503 is connected between 500 and 504.

A second order local dominant pole is provided in the local closed loop forward transfer of amplifier 502 by the local negative feedback network connected to 502 consisting of:

resistor 513 connected between ground 501 and the inverting input of 502, series resistor 505 and capacitor 506 connected between the inverting input of 502 and a first node, resistor 508 connected between the said first node and 501, and capacitor 507 connected between the output of 502 and the said first node.

A first order local dominant pole is provided in the local closed loop forward transfer of differential amplifier 509 by the local negative feedback network connected to 509 consisting of:

resistor 510 connected between the output of 502 and the inverting input of 509, series connected resistor 511 and capacitor 512 connected between the inverting input of 509 and the output of 509. The non-inverting input of 509 is connected to ground 501.

The output of 509 is connected to the input of an unity gain error corrected output stage, consisting of differential amplifier 520, buffer amplifier 525, resistors 519, 521, 524, 526 and capacitors 522, 523 and 527.

The forward transfer from 504 to the output of 509 forms a $3^{rd}$ order local dominant pole; a second order in series with a first order. If the local dominant pole of the error corrected output stage is ignored, then this $3^{rd}$ order local dominant pole provided by the closed loop forward transfer of 502 and 509 provides a $3^{rd}$ order global dominant pole for the whole amplifier.

The mathematical forward transfer function in the frequency domain between 504 and the output of 509, assuming ideal components is $$F1=\{1+R2/R1-1/(w^2C1R1C3R3)-j(1/(C1R1)+(1+R2/R1)/(C3R3))/w\}\{j/(wC4R4)-R5/R4\} \quad (1).$$

Here, the values of the components are as follows:
R1=513, R2=505, C1=506, R3=508, C3=507, R4=510, R5=511, C4=512, and w is the frequency in rads/S.

If say R1=R3=R4=R5=100 ohms, C1=C3=3.3 nF, C4=100 pF and R2=10 ohms, then at audio and ultrasonic frequencies, the forward transfer function is approximately $$F1=-j/(w^3C1R1C3R3C4R4) \quad (2).$$

Thus, at say 1 kHz, this is approximately 190 dB, and at 100 kHz, this is approximately $100^3$ times less (=120 dB less) or thus 70 dB.

In comparison, a typical $1^{st}$ order amplifier, with a closed loop gain of the order of 30 dB, has at most a forward transfer gain of about 90 dB at 1 kHz (overall negative feedback path open), and 50 dB at 100 kHz. 100 kHz is the $5^{th}$ harmonic of 20 kHz; traditionally the highest frequency measured in audio amplifier harmonic measurements.

As typical complementary voltage follower power MOSFET stages have useful responses up to a few MHz for unconditional stability, the forward transfer function (1) must be of the order of the amplifier closed loop gain at these frequencies. If the closed loop gain is of the order of 30 dB, the above values easily satisfy this criterion. If "video" or "wide-band" operational amplifiers and "wideband" transistors which are now of low cost and common, are implemented in circuitry within 502 and 509, these components will add little in terms of phase shift at a few MHz and thus will not intrinsically affect the stability criteria.

The error corrected output stage in FIG. 1 consists of differential operational amplifier 520, and the $1^{st}$ order simulated output stage power transistors which consists of the unity gain buffer 525, and resistor 526 and capacitor 527. The time constant of the simulated low pass filter is the value of 526 multiplied by the value of 527 and in practice is of the order of 100 nS. 520 is wired up as a second order local dominant pole servo loop about the output stage, where resistor 521 is connected between the output 530 and inverting input of 520, series connected resistor 519 and capacitor 522 are connected between the inverting input of 520 and a second node, resistor 524 is connected between the output 530 and the said second node, and capacitor 523 is connected between the second node and the output of 520. The output of 520 is connected to the input of the low pass filter, namely resistor 526 which is connected to capacitor 527. The error corrected output stage input is at the non-inverting input of 520. The benefits of this $2^{nd}$ order error corrected output stage have been described in my cited patents.

The forward transfer function of the whole "amplifier" in FIG. 1 is:

$$F2=(F1BG)/((B+jwt)(G+1)-F1B) \quad (3)$$

Where G=the closed loop gain=(the value of 531)/(the value of 503), and $$B=1+R7/R6-1/(w^2C6R6C8R8)-j(1/(C6R6)+(1+R7/R6)/(C8R8))/w$$

Here, the values of the components are as follows:
R6=521, R7=519, C6=522, R8=524, C8=523, and the value of the time constant of the value of resistor 526 multiplied by the value of 527 is t.

If R6=R7=R8=100 ohms, and C6=C8=2.2 nF, then the whole amplifier open loop gain in terms of breaking the amplifier closed loop at the input to the output transistors, say at the input to 525, with the amplifier input grounded is approximately $$F3 = 1/((w^5 C1R1C3R3C4R4C6R6C8R8)(G+1)) \quad (4)$$

at audio and ultrasonic frequencies.

At 1 kHz F3=275 dB and at 20 kHz, F3=75 dB, where G=30. Note this is the negative feedback factor taking the amplifier gain into account unlike values for F1 above. For a traditional $1^{st}$ order global dominant pole audio power amplifier, these values are at most of the order of 60 and 20 dB respectively.

It should be noted that F1 deceases with frequency at a rate of 18 dB per octave and F3 at 30 dB per octave. In this application, I define a global third order dominant pole in an audio amplifier to at least exhibit an open loop gain, with the local negative feedback path containing the pole forming networks closed, which approximately decreases at 18 dB per octave for at lease a few decades of the audio and ultrasonic bands. Similarly, a fifth order dominant pole exhibits an open loop gain with local negative feedback path containing the pole forming networks closed, which approximately decreases at 30 dB per octave for at lease a few decades of the audio and ultrasonic bands.

Figure 2:
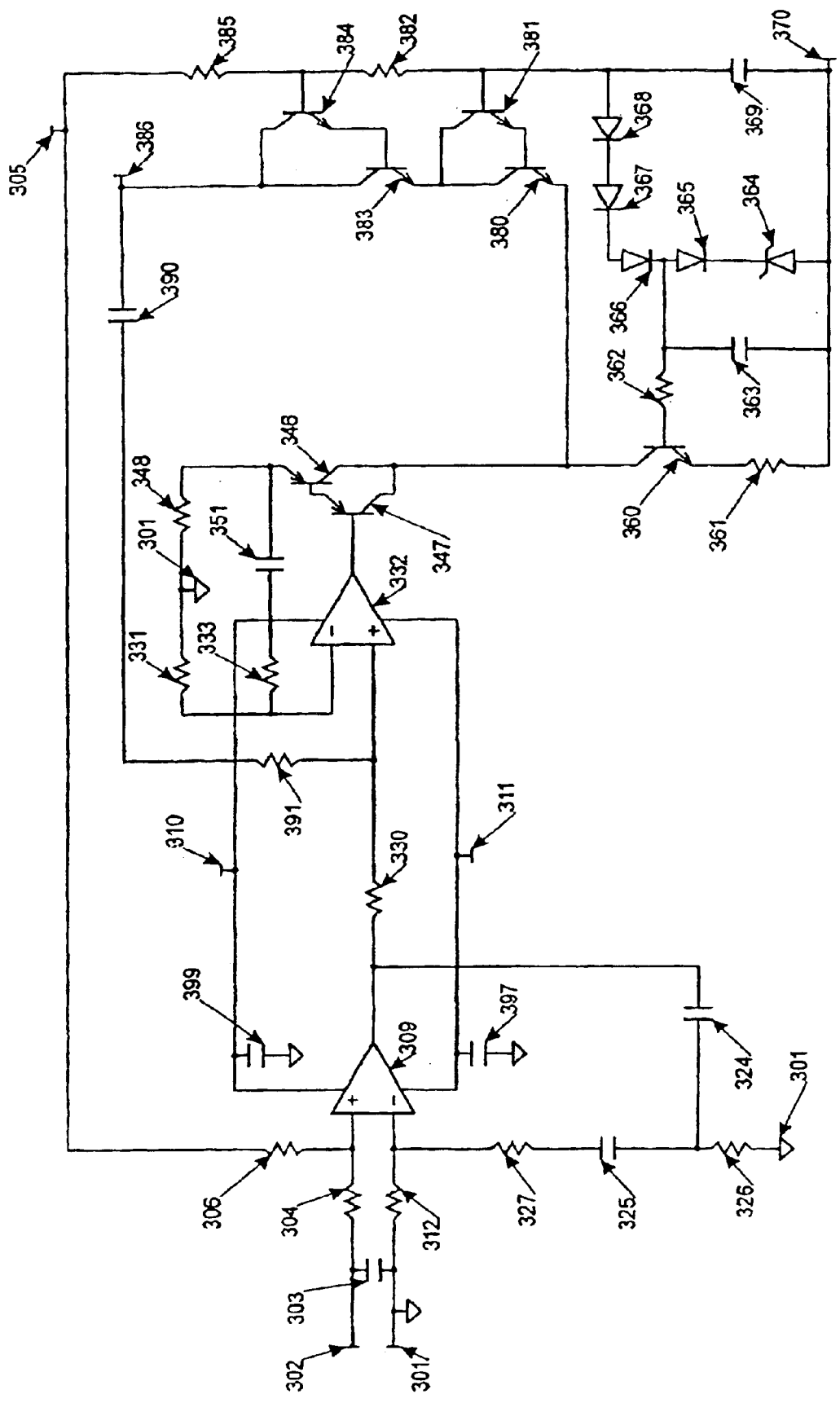
FIG. 2 shows the input stage and voltage amplifying stage part of an amplifier with a $3^{rd}$ order global dominant pole, with any output stage local dominant pole ignored.
Figure 3:
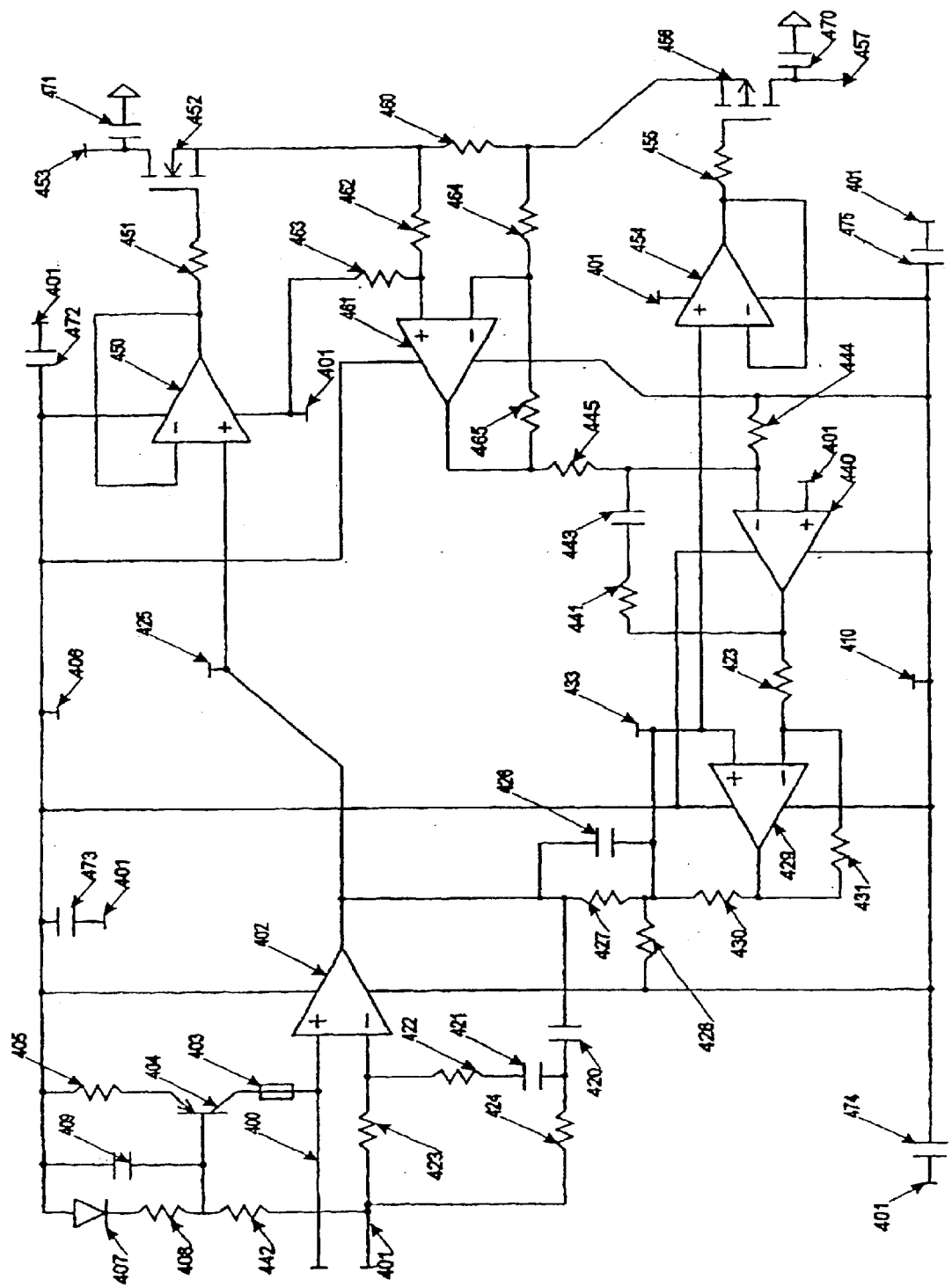
FIG. 3 shows the error correction part of a second order local dominant pole error corrected output stage.
Figure 4:
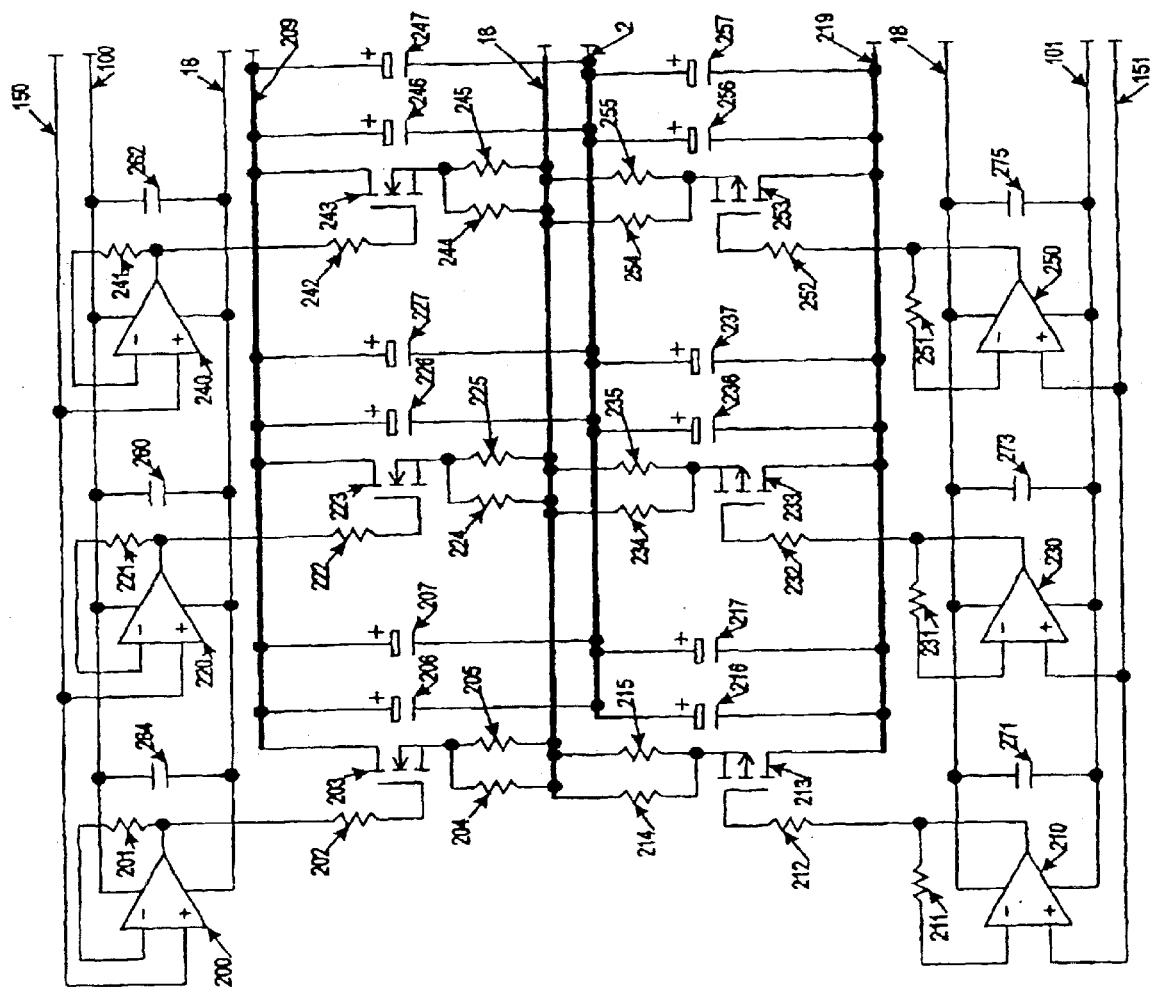
FIG. 4 shows the output buffers and output transistors of an output stage.

FIGS. 2, 3 and 4 show an example of a circuit diagram of an amplifier with a $5^{th}$ order global dominant pole as measured with the closed loop opened at the output transistors. FIG. 2 shows the input stage and voltage amplifying stage part of an amplifier with a $3^{rd}$ order global dominant pole, with any output stage local dominant pole ignored. FIG. 3 shows the error correction part of a second order local dominant pole error corrected output stage, and FIG. 4 shows the output buffers and output transistors of an output stage.

This example is of an asymmetric circuit relative to the positive and negative power supply rails. This is for simplicity, and the same basic description could equally be applied to more or fully symmetric circuitry.

With reference to FIG. 2: The amplifier input is applied at 302, relative to ground 301. Across this input is a capacitor 303. This ensures the input impedance is low in the MegaHertz range to ensure global negative feedback stability. Resistor 304 connects 302 to the overall amplifier inverting input at the non-inverting input of differential operational amplifier 309. The overall amplifier negative feedback resistor 306 is connected between this overall amplifier inverting input and the amplifier output 305.

A second order local dominant pole is provided in the local closed loop forward transfer of amplifier 309 by the local negative feedback network connected to 309 consisting of:

resistor 312 connected between ground 301 and the inverting input of 309, series connected resistor 327 and capacitor 325 connected between the inverting input of 309 and a third node, resistor 326 connected between the said third node and ground 301, and capacitor 324 connected between the output of 309 and the said third node.

A first order local dominant pole is provided in the local closed loop forward transfer of the voltage amplifier stage consisting of differential operational amplifier 332, resistors 330, 331, 333, 348, 391, 361, 362, 382, 385, capacitors 351, 390, 363, 369, diodes 365, 366, 367, 368, reference diode 364, and transistors 346, 347, 360, 380, 381, 383 and 384. The input of the voltage amplification stage is connected to the output of the input stage at the output of 309. This voltage amplifier stage input is connected to 330 which is connected to the non-inverting input of 332. The output of 332 is connected to the input base of the Darlington connected transistor pair 347 and 346. The emitter of this Darlington connected transistor pair is connected to ground 301 via resistor 348. This emitter is also connected via a local negative feedback path to the inverting input of 332 via series connected capacitor 351 and resistor 333. Resistor 331 is connected between ground 301 and the inverting input of 332. The collectors of the Darlington connected transistor pair 347 and 346 are connected to the collector of 360 and the emitter of Darlington connected transistor pair 380 and 381. The emitter of 360 is connected to negative voltage supply rail 370 via resistor 361, and the base of 360 is connected to diodes 365 and 366 and capacitor 363 via resistor 362, which is implemented for high frequency stability purposes. Series connected diodes 365 and 364 are connected in parallel across capacitor 363, and 363 and 364 are connected to 370. Series connected diodes 366, 367 and 368 are connected between diode 365 and the input base of Darlington connected transistor pair 380 and 381. This base is a.c. coupled to 370 via capacitor 369. A constant current flows from 360 approximately equal to the voltage across 364 divided by the value of 361. The collectors of Darlington connected transistor pair 380 and 381 are connected to the emitter of Darlington connected transistor pair 383 and 384. Resistor 382 is connected between the input bases of Darlington connected transistor pair 380 and 381 and pair 383 and 384. Resistor 385 is connected between the input base of Darlington connected transistor pair 383 and 384 and the amplifier output 305. The collectors of Darlington connected transistor pair 383 and 384 is connected the output of the voltage amplification stage 386. Series connected capacitor 390 and resistor 391 is connected between 386 and the voltage amplification stage virtual earth input at the non-inverting input of 332. The forward $1^{st}$ order dominant pole of the voltage amplifier stage is selected by the choice of 391 and 390. The local negative feedback path via resistor 333 and capacitor 351 sets the local servo loop dominant pole required for local closed loop stability.

309 and 332 are supplied by power rails 310 and 311 which are a.c. coupled to ground via capacitors 399 and 397.

The forward transfer function between the overall amplifier inverting input at the non-inverting input of 309 and the output of the voltage amplification stage at 386 is approximately given by equation (1) where the value of 312=R1, 327=R2, 325=C1, 326=R3, 324=C3, 330=R4, 391=R5, and 390=C4.

With reference to FIG. 3:

The input of the error corrected output stage is at 400, which is connected to 386. 400 is connected to the non-inverting input of differential operational amplifier 402.

A second order local dominant pole is provided in the local closed loop forward transfer of amplifier 402 by the local negative feedback network connected to 402 consisting of:

resistor 423 connected between the amplifier output 401, the same as 305, and the inverting input of 402, series connected resistor 422 and capacitor 421 connected between the inverting input of 402 and a fourth node, resistor 424 connected between the said fourth node and the amplifier output 401, and capacitor 420 connected between the output of 402 and the said fourth node.

The quiescent current flowing through the cascode connected Darlington connected transistor pairs 380, 381, 383 and 384, is set by a constant current flowing from the collector of transistor 404 via ferrite bead 403, which may be required for high frequency stability. The emitter of 404 is connected to floating positive supply rail 406 via resistor 405. Resistor 442 is connected between 401 and the base of 404. Capacitor 409 a.c. couples the base of 404 to 406 and series connected resistor 408 and diode 407 is connected between 406 and the base of 404.

The output of 402 is connected to the inputs of the N-channel buffer driver amplifiers shown in FIG. 4 at 425, which is also connected to the non-inverting input of buffer amplifier 450. The inverting input of 450 is connected to it's output, which feeds the gate resistor 451 of N-channel FET 452 which is thermally connected to the output power FETs in FIG. 4. The drain of 452 is connected to positive power rail 453, which is a.c. coupled to ground via capacitor 471.

The output of 402 is also connected to the inputs of the P-channel buffer driver amplifiers shown in FIG. 4 at 433, which is also connected to a constant current source consisting of differential amplifier 429, resistors 428, 431, 423 and 430, and also the non-inverting input of buffer amplifier 454 via parallel connected capacitor 426 and resistor 427. The inverting input of 454 is connected to it's output, which feeds the gate resistor 455 of P-channel FET 456 which is thermally connected to the output power FETs in FIG. 4. The drain of 456 is connected to negative power rail 457, which is a.c. coupled to ground via capacitor 470.

The current flowing through 452 and 456, via their sources, passes through resistor 460, producing a voltage which is measured and amplified by the differential connected amplifier consisting of differential operational amplifier 461 and resistors 463, 462, 464 and 465. 463 is connected between the amplifier output 401 and the non-inverting input of 461. 462 is connected between the source of 452 and the non-inverting input of 461. 464 is connected between the source of 456 and the inverting input of 461, and 465 is connected between the inverting input of 461 and it's output. The output of 461 is connected to the inverting input of differential operational amplifier 440 via resistor 445. Series connected resistor 441 and capacitor 443 is connected between the output of 440 it's inverting input. The non-inverting input of 440 is connected to 401, and resistor 444 is connected between the inverting input of 440 and floating negative supply rail 410. The output of 440 is connected to the control input of the said constant current source consisting of differential amplifier 429, resistors 428, 431, 423 and 430, namely to 423. 428 is connected between 433 and floating negative supply rail 410. 430 is connected between 433 and the output of 429. 431 is connected between the output of 429 and it's inverting input. 423 is connected between the output of 440 and the inverting input of 429.

The differentially connected amplifier consisting of differential operational amplifier 461 and resistors 463, 462, 464 and 465, and the said constant current source consisting of differential amplifier 429, resistors 428, 431, 423 and 430, and the servo loop dominant pole setting amplifier consisting of differential amplifier 440, resistors 441, 444 and 445, and capacitor 443, together with resistor 427, buffers 450 and 454, and FETs 452 and 456 and resistor 460, form a thermally tracking servo loop which sets the output power transistors quiescent current. This is selected by the choice of 445 and 444. The floating supply rails 406 and 410 track the output 401 and are a.c. coupled to it by capacitors 472, 473, 474 and 475. 402, 429 and 440 are supplied with power by 406 and 410, and 450 by 406 and 401, and 454 by 401 and 410.

With reference to FIG. 4, three complementary identical parallel power output pairs are shown. One such pair consists of two buffer amplifiers 200 and 210, resistors 201, 202, 204, 205, 211, 212, 214, 215, an N-channel output FET source follower 203 and a P-channel output FET source follower 213. The node 150, which is connected to 425, feeds and non-inverting input of 200. The supply to 200 is derived from the amplifier output 18, which is the same as 305 and 401, and the positive floating supply rail 100, which may be the same as 406. The output of 200 is connected back to the inverting input of 200 via a resistor 201, which is only necessary if 200 is a "current feedback" operational amplifier. The output of 200 is connected to a resistor which is connected to the gate of 203. The drain of 203 is connected to positive power rail 209 and its source is connected to the output 18 via parallel resistors 204 and 205. The node 151, which is connected to 433, feeds into the non-inverting input of amplifier 210. The supply to this amplifier is derived from the output 18 and the negative floating supply rail 101, which may be the same as 410. The output of 210 is connected back to the inverting input of 210 via a resistor 211, which is only necessary if 210 is a "current feedback" operational amplifier. The output of 210 is connected to a resistor which is connected the gate of 213. The drain of 213 is connected to negative power rail 219 and its source is connected to the output 18 via parallel resistors 214 and 215. 200 and 210 may simply be a "buffer amplifiers." Decoupling capacitors 206 and 207 are connected between 209 and ground 2 and decoupling capacitors 216 and 217 are connected between 219 and ground 2. Decoupling capacitor 264 is connected between floating rail 100 and 18 and decoupling capacitor 271 is connected between floating rail 101 and 18.

This complementary pair of output transistors are simply source followers whose gates are supplied by buffers.

Any number of these stages may simply be connected in parallel as shown in FIG. 3, for example, where 3 such parallel pairs are shown. The role and connections of the following are identical: amplifiers 200, 220, 240, resistors 201, 221, 241, capacitors 264, 260, 262, resistors 202, 222, 242, N-channel power transistors 203, 223, 243, resistors 204, 205, 224, 225, 244, 245, amplifiers 210, 230, 250, resistors 211, 231, 251, capacitors 271, 273, 275, resistors 212, 232, 252, P-channel transistors 213, 233, 253, resistors 214, 215, 234, 235, 254, 255, capacitors 206, 207, 226, 227, 246, 247 and capacitors 216, 217, 236, 237, 256, 257.

For integrated circuit operational amplifiers, "wideband" could be considered to be a gain bandwidth product of more than say 100 MHz, with an open loop gain of more than say 200V/V, and a "wideband" transistor is a device with a transition frequency exceeding say 500 MHz.

In accordance with the teaching of this invention, an amplifier has been built that produces distortion harmonics to a 20 kHz sinewave of the order of 100 parts per billion, that is, of the order of −140 dB at several hundred watts output power.

What is claimed is:

1. An electronic amplifier having an input and an output, and including an output stage containing output transistors being connected to the electronic amplifier output, the electronic amplifier input being connected to an input stage, an output of the input stage being connected to the input of the output stage, the input and the output of the electronic amplifier being operatively connected, wherein a global dominant pole is formed which, not taking account of effects of any output stage local dominant pole, is at least of third order, at least at audio frequencies.

2. The electronic amplifier as in claim 1 further including within the input stage, at least two amplifiers, a first and second amplifier, wherein the electronic amplifier input is connected to an input of the first amplifier, and an output of the first amplifier is connected to an input of the second amplifier, and an output of the second amplifier is connected to an input of the output stage, wherein there are at least two local negative feedback paths, a first and second local negative feedback path, a first local negative path being between an output of the first amplifier and an input of the first amplifier, a second local negative path being between an output of the second amplifier and an input of the second amplifier, and an overall negative feedback path is connected between an input of the first amplifier and the output stage, wherein the circuit arrangement and values of the said first and second local negative feedback paths and first and second amplifier and overall negative feedback path are selected to contain at least a third order global dominant pole, at least at audio frequencies, which herein is defined not to include the effects of any output stage local dominant pole.

3. The electronic amplifier as in claim 2 wherein the a first local negative path forms at least a local dominant pole about the first amplifier, a first local dominant pole, and the second local negative path forms at least a local dominant pole about the second amplifier, a second local dominant pole, and further, either the said first or second local dominant pole is at least first order and the other at least second order, at least at audio frequencies.

4. The electronic amplifier as in claim 3 wherein the said second amplifier consists of two series connected amplifiers, a third and fourth amplifier, and the said second local negative feedback path is connected between an output of the fourth amplifier and the input of the said third amplifier, and a third local negative feedback path is connected between an output of the third amplifier and an input of the third amplifier.

5. The electronic amplifier as in claim 3 wherein the output stage includes an output error correction stage containing at least one amplifier, a fifth amplifier, an input to the output stage being connected to an input of the fifth amplifier, wherein there are at least two local negative feedback paths, a fifth and sixth local negative feedback path, a fifth local negative feedback path being between an output of the output stage and an input of the fifth amplifier and a sixth local negative path being between an output of the fifth amplifier and an input of the fifth amplifier, an output of the fifth amplifier is connected to an input of output stage transistor buffers or the output stage transistors, an output of output stage transistor buffers, if used, being connected to an input of the output transistors, wherein the circuit arrangement and values of the said fifth and sixth local negative feedback paths and fifth amplifier and output transistors and output transistor buffers are selected to contain at least a first order local dominant pole, a third local dominant pole, at least at audio frequencies.

6. The electronic amplifier as in claim 4 wherein the output stage includes an output error correction stage containing at least one amplifier, a fifth amplifier, an input to the output stage being connected to an input of the fifth amplifier, wherein there are at least two local negative feedback paths, a fifth and sixth local negative feedback path, a fifth local negative feedback path being between an output of the output stage and an input of the fifth amplifier and a sixth local negative path being between an output of the fifth amplifier and an input of the fifth amplifier, an output of the fifth amplifier is connected to an input of output stage transistor buffers or the output stage transistors, an output of output stage transistor buffers, if used, being connected to an input of the output transistors, wherein the circuit arrangement and values of the said fifth and sixth local negative feedback paths and fifth amplifier and output transistors and output transistor buffers are selected to contain at least a first order local dominant pole, a third local dominant pole, at least at audio frequencies.

7. The electronic amplifier as in claim 2, wherein, at least one of the said first and second amplifiers is a wideband differential operational amplifier with a gain-bandwidth product of greater than 100 MHz and direct current open loop differential voltage gain of more than 200V/V.

8. The electronic amplifier as in claim 3, wherein, at least one of the said first and second amplifiers is a wideband differential operational amplifier with a gain-bandwidth product of greater than 100 MHz and direct current open loop differential voltage gain of more than 200V/V.

9. The electronic amplifier as in claim 4, wherein, at least one of the said first and second amplifiers is a wideband differential operational amplifier with a gain-bandwidth product of greater than 100 MHz and direct current open loop differential voltage gain of more than 200V/V.

10. The electronic amplifier as in claim 5, wherein, at least one of the said first, second, third or fifth amplifiers is a wideband differential operational amplifier with a gain-bandwidth product of greater than 100 MHz and direct current open loop differential voltage gain of more than 200V/V.

11. The electronic amplifier as in claim 6, wherein, at least one of the said first, second, third or fifth amplifiers is a wideband differential operational amplifier with a gain-bandwidth product of greater than 100 MHz and direct current open loop differential voltage gain of more than 200V/V.

12. The electronic amplifier as in claim 5 wherein the fifth amplifier is supplied by power from a floating power supply means coupled to an output of the output stage so that a voltage of the floating power supply supplying the fifth amplifier will follow substantially an output voltage of the output stage when operational.

13. The electronic amplifier as in claim 6 wherein the fifth amplifier is supplied by power from a floating power supply means coupled to an output of the output stage so that a voltage of the floating power supply supplying the fifth amplifier will follow substantially an output voltage of the output stage when operational.

14. The electronic amplifier as in claim 5 wherein the said third local dominant pole is at least second order.

15. The electronic amplifier as in claim 6 wherein the said third local dominant pole is at least second order.

16. The electronic amplifier as in claim 1 capable of delivering at least 5 Watts output into 8 ohms at least at audio frequencies.

* * * * *